United States Patent [19]

Suni

[11] Patent Number: 4,967,249

[45] Date of Patent: Oct. 30, 1990

[54] GAIN COMPRESSION PHOTODETECTOR ARRAY

[75] Inventor: Paul P. Suni, San Mateo, Calif.

[73] Assignee: Loral Fairchild Corporation, Syosset, N.Y.

[21] Appl. No.: 324,925

[22] Filed: Mar. 17, 1989

[51] Int. Cl.[5] ............... H01L 29/78; H01L 27/14; H04N 3/14; G11C 19/28

[52] U.S. Cl. ............................... 357/24; 357/30; 377/58; 358/213.19

[58] Field of Search ............... 357/24, 30; 358/213.19; 377/57-63

[56] References Cited

U.S. PATENT DOCUMENTS

| | | |
|---|---|---|
| 3,403,284 | 9/1968 | Buck et al. . |
| 3,465,159 | 9/1969 | Stern . |
| 3,845,295 | 10/1974 | Williams et al. ............ 357/24 |
| 3,896,485 | 7/1975 | Early ............................ 357/24 |
| 3,916,429 | 10/1975 | Kostelec . |
| 3,931,465 | 1/1976 | Levine .......................... 357/24 |
| 3,932,775 | 1/1976 | Kosonocky ................... 357/24 |
| 3,996,600 | 12/1976 | Patrin ........................... 357/24 |
| 4,174,528 | 11/1979 | White . |
| 4,206,371 | 6/1980 | Weimer . |
| 4,322,753 | 3/1982 | Ishihara ........................ 357/24 |
| 4,450,484 | 5/1984 | Terakawa et al. . |
| 4,473,836 | 9/1984 | Chamberlain . |
| 4,488,165 | 12/1984 | Levine . |
| 4,590,505 | 5/1986 | Bluzer . |
| 4,620,214 | 10/1986 | Margalit et al. . |
| 4,636,980 | 1/1987 | Bluzer . |
| 4,651,180 | 3/1987 | Nishizawa et al. . |
| 4,656,494 | 4/1987 | Kobayashi et al. . |
| 4,694,318 | 9/1987 | Capasso et al. . |

FOREIGN PATENT DOCUMENTS 1173542 8/1984 Canada ................................ 345/1
2753588 7/1978 Fed. Rep. of Germany ........ 357/24 LR

OTHER PUBLICATIONS

White et al, "A Multiple-Gate CCD-Photodiode Sensor Element for Imaging Arrays", IEEE Trans. Electron Devices, vol. ED-25 (2/78), pp. 125-131.

Chamberlin & Lee, "A Novel Wide Dynamic Range Silicon Photodetector and Linear Imaging Array", IEEE Trans. Elect. Dev., vol. ED-31, No. 2, Feb. 1984, pp. 175-182.

Meindl, "Microelectronic Circuit Elements", Microelectronics: A Scientific American Book, pp. 22-23, Piel et al., eds., W. H. Freeman & Co., San Francisco, Calif., 1977.

Primary Examiner—Gene M. Munson
Attorney, Agent, or Firm—Townsend and Townsend

[57] ABSTRACT

An improved gain compression device is disclosed, especially for use in charge-coupled devices. The device is preferably constructed on a semiconductor substrate and includes a first potential well in close proximity to a mobile charge packet generation region. A second potential well is separated from the generation region by a diffusion region. The first potential well becomes saturated and drains to a drain region while the second potential well continues to fill.

9 Claims, 4 Drawing Sheets

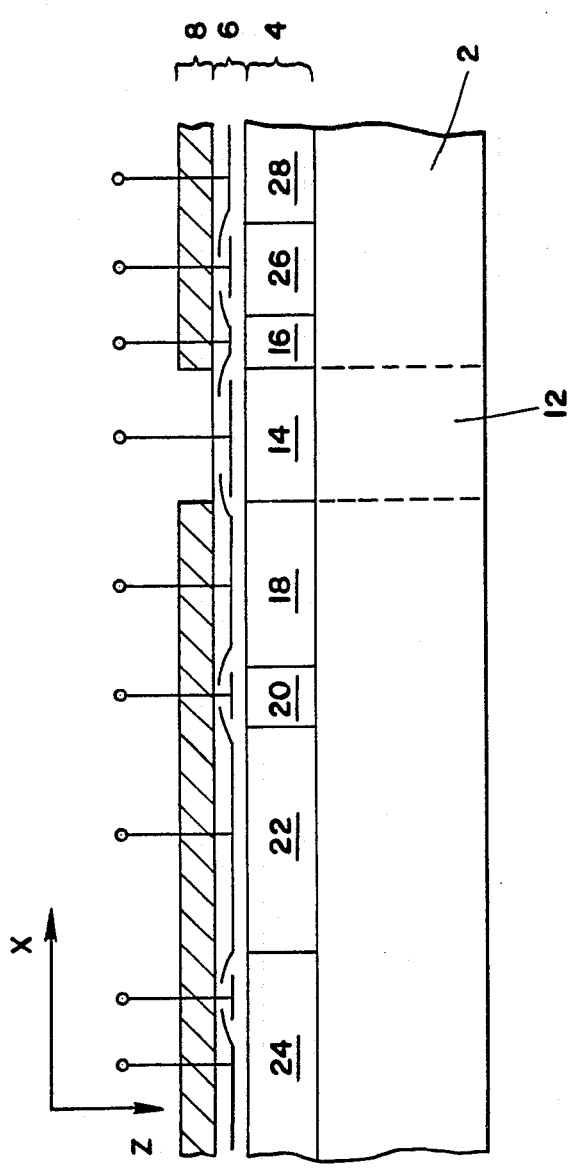
FIG_1

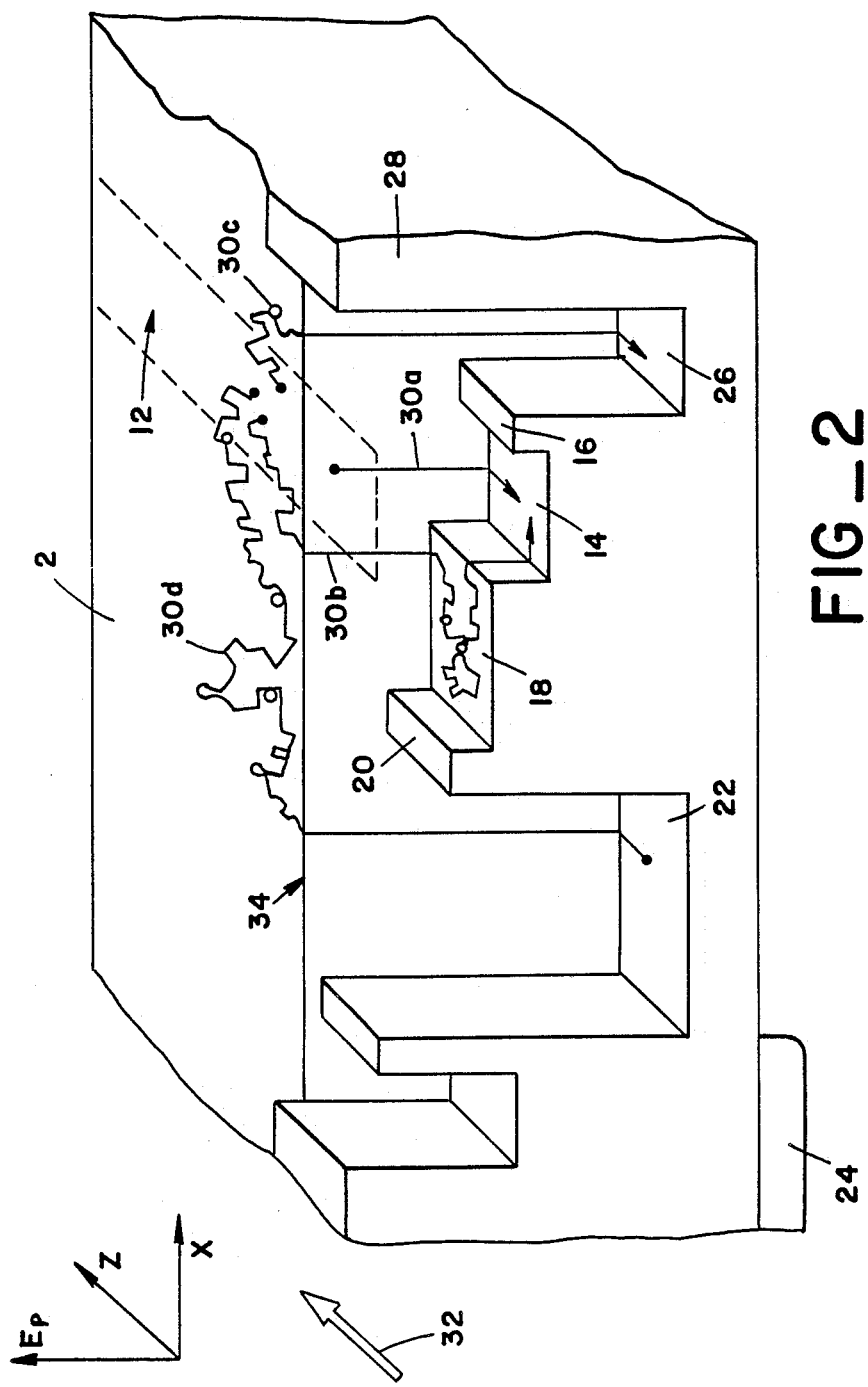
FIG_2

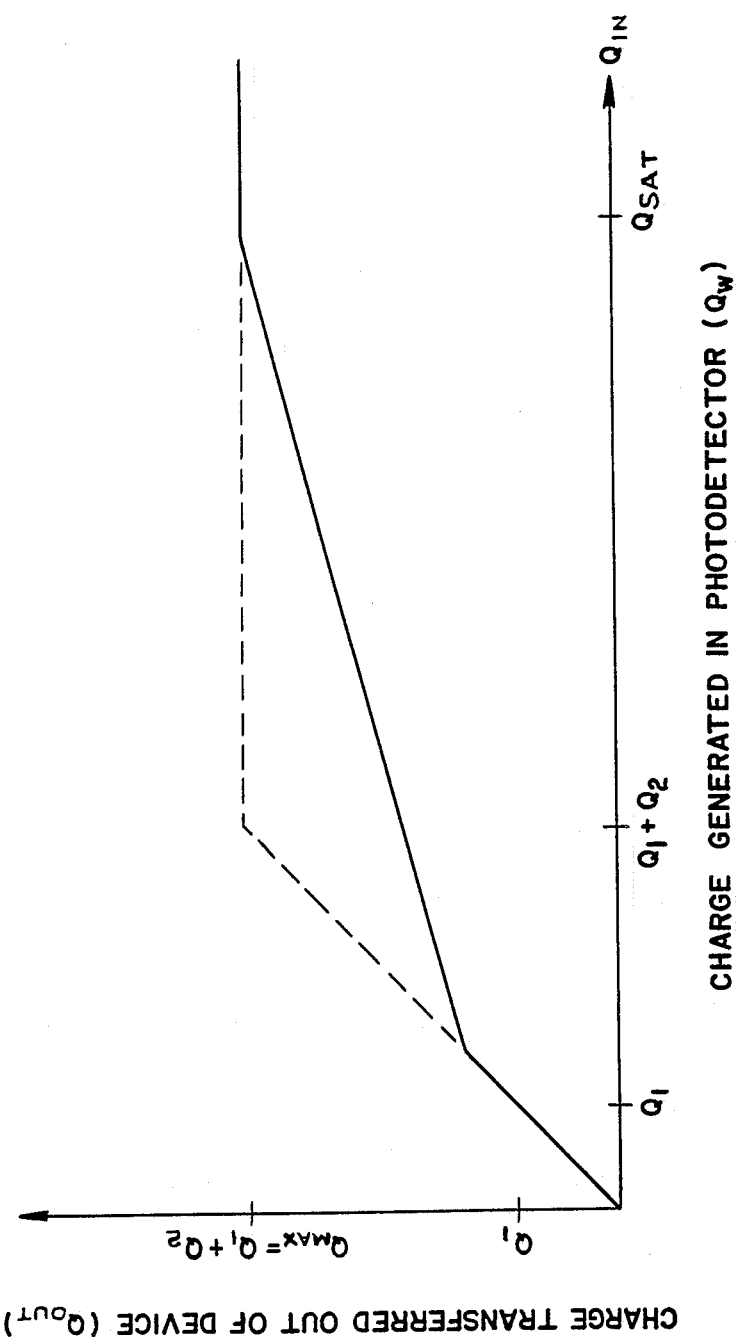
FIG_3

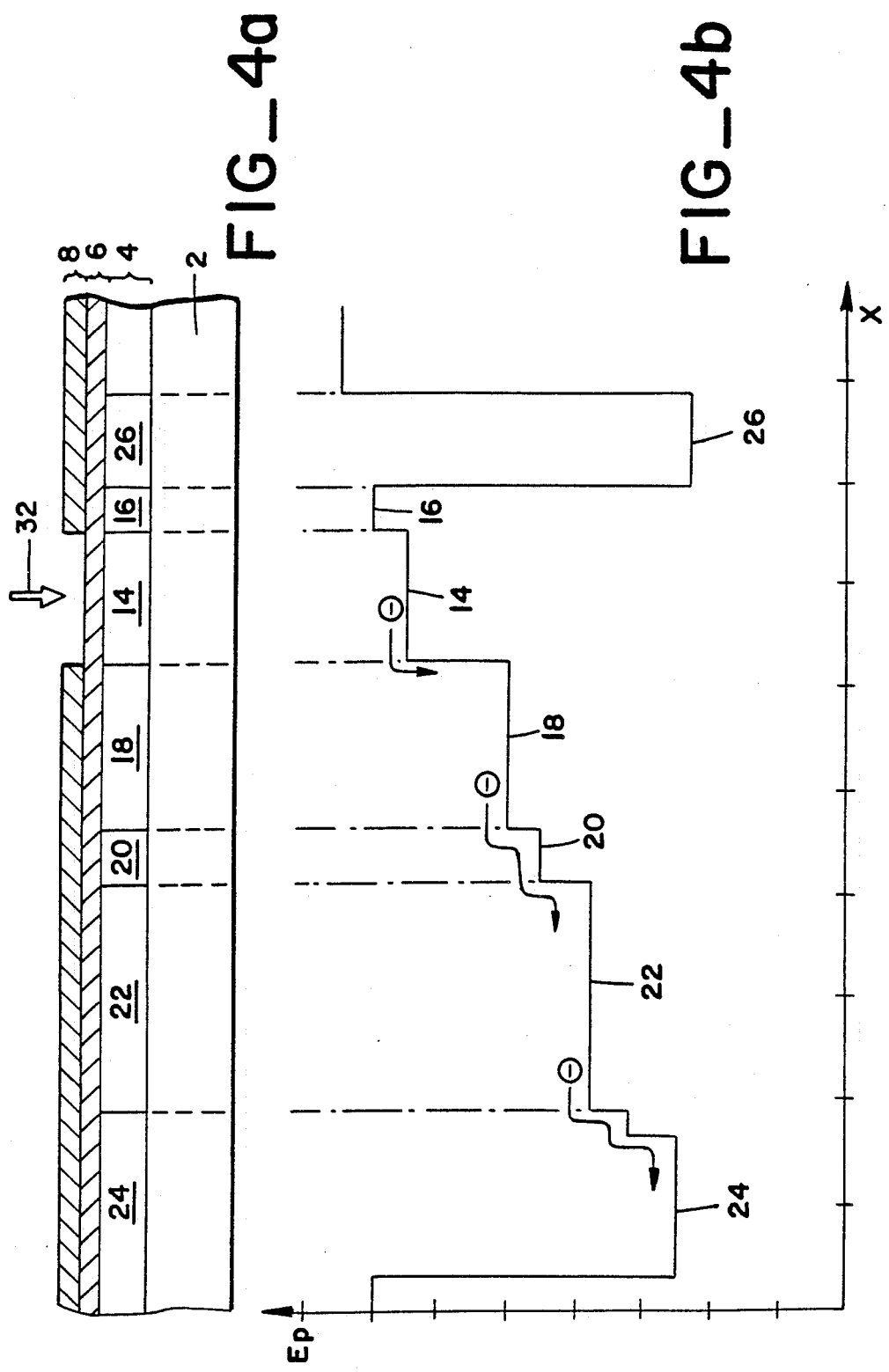

GAIN COMPRESSION PHOTODETECTOR ARRAY

CROSS-REFERENCE TO RELATED APPLICATIONS

This application is related to application Ser. No. 07/183,111, assigned to the assignee of this invention, and an application having Ser. No. 07/324,923, also assigned to the assignee of this invention.

BACKGROUND OF THE INVENTION

1. Field of the Invention

The present invention relates to the field of semiconductor devices. More particularly, the present invention provides a charge-coupled device with automatic gain compression.

2. Description of Related Art

It is well known in the art of semiconductor devices that MOS devices without a source region may be useful in performing certain electrical functions. In general, these devices have been termed charge transfer devices (CTD's) and charge injection devices (CID's). Two types of charge transfer devices are bucket brigade devices and charge-coupled devices (CCD's).

In a charge-coupled device, mobile charge packets (electrons or holes) are introduced into a silicon substrate such as a p- or an n+substrate. The charge packets may be introduced electrically, or with photon bombardment, such as would be the case in a charge-coupled imager (CCI). After an integration time, the mobile charge packets are moved along the surface of the substrate by applying clocked voltages to electrodes located on the surface of the substrate. The mobile charge packets can eventually be used in, for example, linear or area imaging. Charge-coupled devices are described in Meindl, *Microelectronics: A Scientific American Book*, pp. 22-23.

Problems arise in charge-coupled devices when substantial amounts of charge accumulate in a small region of the substrate. When substantial amounts of charge accumulate, it is possible that a collection region has insufficient capacity to accommodate the number of carriers which are generated, i.e., the collection region becomes saturated. Saturation occurs if, for example, an extremely high-intensity light is directed at a charge-coupled imager.

To overcome the above described problem, a variety of solutions have been proposed. For example, in U.S. Pat. No. 3,916,429 various values of reverse bias are applied to gating diodes to make the depletion depth large. The problem with this solution is that the amount of gain compression that can be obtained is limited because impractically large potential differences must be applied to achieve effective gain control. Further, for some wavelengths of light (e.g., blue light), the technique is ineffective because charge is collected near the surface in any event.

Other more sophisticated versions of the above solution have also been proposed. For example, Bluzer, U.S. Pat. No. 4,636,980, discloses a device in which gain is varied exponentially in real time using a programmable gain control. Again, gain control is obtained via an applied bias voltage.

Weimer, U.S. Pat. No. 4,206,371 discloses a readout system for a CCD. An electrode is placed over, for example, a P-- region and a P--- region. A P-region serves as a barrier between the P-- region and the P--- region. Charge is moved within the substrate by applying varying voltages to the electrode. When the electrode potential is high, charge is retained in the P-- region. As the electrode potential is lowered, charge is generally moved from the P-- area over the barrier region to the P--- region. Eventually, essentially all of the charge is removed from the P--region to the P--- region. No method or apparatus of providing gain in the device is shown or suggested.

SUMMARY OF THE INVENTION

An improved charge-coupled device with gain compression is disclosed. In general, a first potential well is located in close proximity to a mobile charge packet generation area. The charges in the preferred embodiment are generated by photon bombardment and may be either electrons or holes. A diffusion area is provided which distributes a portion of the generated charge to a first potential well. Another portion of the charge is distributed by random diffusion of the charges through the diffusion area to a second potential well. A first potential barrier is provided between the first and the second potential well. A second potential barrier is provided adjacent the first potential well opposite the first potential barrier. A drain region is provided adjacent the second potential barrier. Charge accumulates and saturates the first potential well, draining any excess to the drain region. Simultaneously, charge is accumulated in the second potential well. After an integration time, the charge is transferred out of the first and the second potential well and added. Highly regular gain compression is obtained.

BRIEF DESCRIPTION OF THE FIGURES

FIG. 1 illustrates a vertical cross-section of a charge-coupled device using the gain compression device described herein.

FIG. 2 illustrates the device shown in FIG. 1 along with the potential of each region.

FIG. 3 qualitatively plots charge transferred out of the device versus charge generated in the photodetector for a conventional device and for the invention described herein.

FIG. 4a and 4b illustrate the transfer of charge from the photodetector into the transfer region.

DETAILED DESCRIPTION OF THE PREFERRED EMBODIMENTS

FIG. 1 generally illustrates in cross-section a device fabricated in accordance with the invention described herein. The device is constructed on a P- substrate 2 on which a series of potential regions 4 are formed. The vertical thickness of the P-substrate (which is to act as a diffusion area) should be small (e.g., 15-20 μm thick). Preferably, however, this is accomplished by doping, implanting or growing an epitaxial layer of P- on an N-substate and by applying a reverse bias voltage. A series of electrodes 6 are placed above the potential regions and may be metallic electrodes, heavily doped silicon gate electrodes, or the like. It should be recognized that electrodes are used exclusively herein to define the various potentials in the potential regions, but these potential levels could also be defined by doping the regions with selected N- and P-type dopants of the type known to those of skill in the art. A light shield 8 is placed above the electrodes and is provided with a light aperture. Light shield 8 may comprise a metallization layer, carbon black or any other material that would prevent light from entering the secondary well. It will typically be electrically isolated from the electrodes by an intervening layer of insulating material, e.g., silicon dioxide (not shown). Within the substrate and below the light aperture lies a carrier generation region 12.

Within the potential region 4 a primary well 14 is provided Adjacent the primary well an anti-blooming barrier 16 is provided A diffusion channel 18 is provided adjacent the primary well opposite the anti-blooming barrier. Antiblooming barrier 16 is of lower potential than the diffusion channel and serves to define the saturation potential energy level and number of carriers that the primary well 14 can hold. The diffusion channel 18 and a diffusion barrier 20 are located between a secondary well 22 and the primary well so as to separate the primary and secondary wells spatially such that the secondary well has a low collection efficiency, i.e., there is a high probability that a carrier will be swept into the primary well either directly or via the diffusion channel while there is a low probability that the carrier will diffuse into the secondary well. "High probability" is intended to mean herein that the quantum efficiency of the primary well is from several percent to close to 100%. For example, the quantum efficiency for 830 nm laser diode light sources could be about 30% ±5% (for a moderate -- tens of microns -- pixel size). "Low probability" is intended herein to mean lower than the high probability, preferably in the range of 10 to 1,000,000 times less than the primary well, and most preferably about 1000 times less than the primary well (e.g., 0.03%). The secondary well is otherwise referred to herein as the "gain well." The diffusion barrier is optionally provided, but will serve to increase the gain control capabilities of the device.

Transfer register 24 is located adjacent secondary well 22 opposite diffusion barrier 20. The transfer register permits the transfer of collected carriers out of the array into a charge detector.

Adjacent the antiblooming barrier 16 and opposite the primary well 14, a drain 26 and channel stop 28 are provided The channel stop serves to isolate the photodetector from adjacent photodetector elements (not shown) and could be defined by a P+ region. Each of the regions 4 in the substrate 2 may be created by applying various potentials at electrodes 6, by doping the regions with different dopants, or by a combination of the two.

Greater detail regarding the semiconductor device and its operation are provided in FIG. 2 in which the "dimension" of electron potential has been added. Reference numerals of corresponding parts of the device from FIG. 1 are similarly numbered.

In operation, mobile charge carriers, in this case photoelectrons, are generated in the charge generation area 12 as light (illustrated by arrow 32) enters the device. Four possible paths of these photoelectrons are illustrated with paths 30a, 30b, 30c, and 30d.

Photoelectrons generated in the volume of the primary well are immediately confined within the primary well, as indicated by path 30a. However, photoelectrons generated beyond the depletion edge 34 diffuse within the device randomly. For example, as illustrated by path 30b, a photoelectron may diffuse randomly in the substrate until it reaches the diffusion channel 18. Most electrons in the diffusion channel will eventually diffuse into primary well 14 which has a lower potential. As illustrated by path 30c, electrons may also randomly diffuse directly into the drain region 26 and will be retained therein. As illustrated by path 30d, a relatively small fraction of the generated photo-electrons will diffuse randomly until they reach the secondary well 22. A small, but negligible, fraction of the generated photoelectrons (not illustrated) will diffuse directly into the transfer region 24 and adjacent photodetectors (not shown).

As charge is collected in a well the potential energy level of charge within the well rises. Once the potential energy level reaches the level of an adjacent barrier, any additional charge will spill over the barrier into an adjacent well. The carriers collected in the primary well 14 and the secondary well 22 are of primary interest for gain compression.

The total amount of charge collected in the primary and secondary wells may, for example, be represented by $Q_{IN}$. As described above, a certain fraction of the generated charge, $\pi$, is collected in the primary well and a fraction, $\sigma$, is collected in the secondary well as a result of diffusion from the primary well. A small fraction, $\delta$, diffuses into the transfer register, drain, and adjoining photodetectors, but for the sake of the discussion herein, it can be assumed that $\delta = 0$ and that $\pi + \sigma = 1$.

If the amount of charge collected in the primary well is represented by $Q_{1C}$, the amount collected in the secondary well by $Q_{2C}$, and the maximum amount of charge that can be collected in the primary well by $Q_1$, then for very small amounts of charge generated in the device, the total amount of charge collected in the primary and secondary wells (and, therefore, the amount transferred out of the device), $Q_{OUT}$, will equal the amount of charge generated in the device, i.e.:

$$Q_{OUT} = Q_{IN} = Q_{1C} + Q_{2C}.$$

Note that the above assumes a negligible loss of electrons to recombination with holes and negligible losses to the substrate.

For somewhat greater amounts of charge generated in the device, the primary well will become saturated and the total amount of charge collected in the device will be:

$$Q_{OUT} = Q_1 + \sigma Q_{IN}.$$

The difference between the charge generated in the device and the charge collected in the primary and secondary wells will be disposed of in the drain. Note that to ensure that the above is true, the diffusion channel potential should be higher than the antiblooming barrier so that charge will not be stored in the diffusion channel. Further, it is important in the design of the device that the fraction of charge distributed to the secondary well and the capacities of the primary and secondary wells are adjusted such that the primary well fills with mobile charge packets before the secondary well.

Only when a very large amount of charge is generated in the detector (QSAT or greater) will the secondary well and the primary well saturate such that charge flows over the diffusion barrier and anti-blooming barrier into the drain. After that time the amount of charge transferred out of the device will always be $Q_{MAX}$, i.e., the amount of input charge that causes both the primary and secondary wells to saturate, regardless of the amount of charge generated in the device, i.e.:

$$Q_{OUT} = Q_{MAX}$$

where $Q_{MAX}$ is the sum of the maximum storage capacities of the primary and secondary wells, i.e.:

$$Q_{MAX} = Q_1 + Q_2$$

where $Q_1$ is the storage capacity of the primary well and $Q_2$ is the storage capacity of the secondary well.

The gain curve of the above described gain compression device is illustrated in FIG. 3. FIG. 3 shows the amount of charge transferred out of the device as a function of the amount of charge generated in the photodetector for a conventional device (in the dashed line) and for the invention described herein (in the solid line). The conventional device is assumed to have a single well with the combined potential of the primary well and the secondary well, i.e., $Q_1 + Q_2$.

The conventional device generates an output signal directly related to the input signal and becomes saturated at the potential of the single well, i.e., where the charge generated equals $Q_1 + Q_2$. The invention described herein, however, produces a sensitive (i.e., high signal-to-noise ratio) signal up to a point well past $Q_1$ and, in addition, generates a useful signal up to the point where $Q_{IN} = Q_{SAT}$ (which is far greater than $Q_1 + Q_2$). Specifically, the above described structure can usefully process more input signal charge by a factor of $Q_2/(\sigma Q_{MAX})$. Of course, the device can readily be designed by those of skill in the art such that this factor is between 100 and 1000 or higher. The dynamic range of the device is, therefore, improved by the same factor. At the same time, at low values of input charge, the device is able to produce highly accurate output signals.

The device described above can be used effectively without the primary well. In this case, the graph shown in FIG. 3 will have a straight linear gain compression curve, but lacks the high signal-to-noise ratio (i.e., it would have a zero intercept). Conversely, the device could be provided with several secondary wells. In this event, the gain compression curve will have a number of "breaks" or knees that correspond to the saturation of progressive wells. A progressively higher amount of gain compression is obtained for increasing amounts of generated charge.

After charge has been collected in the primary and secondary wells for a period of time (the integration time) the signal charge is transferred from the photodetector into the transfer register, as illustrated in FIGS. 4a and FIG. 4b. To transfer charge from the device, the voltages of the electrodes are modified by a clocked potential signal or the like. The electrode potentials are controlled to establish the potential diagram of FIG. 4b. Specifically, the potential profile of the device is established such that charge from the primary well 14 and the secondary well 22 are transferred into the transfer region 24. This is achieved by placing consecutively lower potentials in wells 16, 14, 18, 20, 22, and 24, respectively. The drain region 26 continues to be isolated from the transfer region by the antiblooming barrier 16.

It is to be understood that the above description is intended to be illustrative and not restrictive. Many embodiments will be apparent to those of skill in the art upon reviewing the above description. For example, while certain of the above embodiments have been illustrated by way of various P and N type doped materials it is generally known in the art that complimentary materials of opposite type may be substituted and biasing potentials may be inverted as well. Thus, in the above description, P and N type materials may be exchanged, N-epitaxial materials may be replaced by P-epitaxial materials, and P+ materials may be replaced by N+ materials. Further, materials other than silicon may readily be used. By way of further example, the above described gain compression technique can be combined with previously known gain detection techniques. In addition, the invention could be applied to charge transfer devices, charge injection devices, metal insulator semiconductor transistor arrays, junction charge coupled devices, Schottky barrier devices, and the like. The scope of the invention should, therefore, be determined not with reference to the above description, but should instead be determined with reference to the appended claims, along with the full scope of equivalents to which such claims are entitled.

What is claimed is:

1. A semiconductor device comprising:
   (a) a mobile charge packet generation region;
   (b) a first potential well adjacent said mobile charge packet generation region, said first potential well having a first potential barrier and a second potential barrier, said first potential barrier greater than said second potential barrier;
   (c) a drain region adjacent said second potential barrier; and
   (d) a plurality of gain wells adjacent said first potential barrier and connected to said generation region by a diffusion region, whereby a gain control curve for said semiconductor device includes a break corresponding to saturation of each of said gain wells.

2. Apparatus as recited in claim 1 wherein said generation region is a semiconductor substrate.

3. Apparatus as recited in claim 2, wherein said potential wells are created by electrodes on a surface of said substrate.

4. Apparatus as recited in claim 1 wherein said generation region is a photoelectron generation region.

5. Apparatus as recited in claim 1 further comprising a transfer region for removing charge from said potential wells.

6. Apparatus as recited in claim 1 wherein said diffusion region creates a low probability that mobile charge carriers will reach said gain well.

7. Apparatus as recited in claim 1, wherein there is a high probability that mobile charge carrier will reach said first potential well.

8. A semiconductor device comprising:
   (a) a mobile charge packet generation region;
   (b) a first potential well adjacent said mobile charge packet generation region, said first potential well having a first potential barrier and a second potential barrier, said first potential barrier greater than said second potential barrier;
   (c) a drain region adjacent said second potential barrier;
   (d) a gain well adjacent said first potential barrier; and
   (e) said first potential barrier further comprising:
      (i) a diffusion area adjacent said first potential well; and
      (ii) a diffusion barrier between said diffusion area and said second potential well, said diffusion area adapted to receive a portion of said mobile charges and return them to said first potential well.

9. A semiconductor device comprising:
(a) a mobile charge packet generation region;
(b) a first potential well adjacent said mobile charge packet generation region, said first potential well having a first potential barrier and a second potential barrier, said first potential barrier greater than said second potential barrier;
(c) a drain region adjacent said second potential barrier;
(d) a gain well adjacent said first potential barrier and connected to said generation region by a diffusion region; and
(e) wherein a portion of charge collected in the first potential well is in the range from 10 to 1,000,000 times more than a portion of charge collected in said gain well.

* * * * *